United States Patent [19]

Thomson

[11] Patent Number: 4,698,530

[45] Date of Patent: Oct. 6, 1987

[54] POWER SWITCH FOR DUAL POWER SUPPLY CIRCUIT

[75] Inventor: Peter K. Thomson, Ralston Paisley, Scotland

[73] Assignee: National Semiconductor Corporation, Santa Clara, Calif.

[21] Appl. No.: 669,930

[22] Filed: Nov. 9, 1984

[51] Int. Cl.$^4$ .................... H03K 17/56; H03K 17/687
[52] U.S. Cl. .................................. 307/571; 307/243; 307/296 R
[58] Field of Search ........... 307/255, 270, 290, 296 R, 307/22, 23, 29, 570, 571, 581; 328/260

[56] References Cited

U.S. PATENT DOCUMENTS

| | | | |
|---|---|---|---|
| 3,959,669 | 5/1976 | Peters | 307/255 |
| 4,375,701 | 3/1983 | Hanson | 328/260 |
| 4,465,945 | 8/1984 | Yin | 307/270 |
| 4,540,893 | 9/1985 | Park | 307/270 |
| 4,540,894 | 9/1985 | Bloomer | 307/270 |

Primary Examiner—Stanley D. Miller
Assistant Examiner—B. P. Davis
Attorney, Agent, or Firm—Gail W. Woodward

[57] ABSTRACT

A power switching circuit 12 for automatically switching between line-driven and battery power supplies 28 and 30 is disclosed. The power switching circuit selectively connects first and second input voltage terminals Vdd and Vbb to an output voltage terminal Vzz. When the line-driven power supply is on, a first transistor Q1 switches on to connect the first input voltage terminal to the output voltage terminal, and a second transistor Q2 switches off to isolate the battery. When the line-driven power supply is off, the first transistor switches off, and the second switches on to connect the battery powered second input voltage terminal to the output voltage terminal.

3 Claims, 5 Drawing Figures

POWER SWITCH FOR DUAL POWER SUPPLY CIRCUIT

BACKGROUND OF THE INVENTION

1. Field of the Invention

This invention relates generally to power switches, and relates more particularly to a circuit for automatically switching between line-driven and battery power supplies.

2. Description of the Relevant Art

A combination of battery and line-driven power supplies are used to power many electronic circuits. In some electronic circuits, it is necessary to provide a continuous supply of power to permit continuous operation of the circuit. For example, a real-time clock circuit requires a continuous supply of power to ensure accurate time keeping. In other electronic circuits, it is desirable to operate from line power when available, and to output from a battery when line power is not available. Portable electronic products are examples of the latter type of circuit. In either case, a battery-driven power supply is utilized in conjunction with a line-driven power supply to provide power to the circuitry. Two approaches have been used in prior art circuits: independent power supplies, and externally switched power supplies.

In a circuit using independent power supplies, a battery provides power to a portion of the circuit that requires continuous power, while a line-driven power supply provides power to the remainder of the circuit. The battery powered portion of the circuit is independent from the line-driven portion of the circuit. As a result, the battery is continuously in use, regardless of whether the line-driven power supply is on or off. Level shifting circuitry is required if the battery voltage is less than that of the line-driven power supply, as is commonly the case, in order to exchange data between the two portions via an internal data bus. Since the battery powers the internal data bus circuitry, exchange of data between the two portions of the circuit involves additional power drain on the battery.

There are several disadvantages to using independent power supplies. One disadvantage is that, since the battery continuously powers a portion of the circuit, there is a large power drain on the battery. Another disadvantage is that, since the battery powers the internal data bus circuitry, access times for the battery powered portion of the circuit are constrained by the need to conserve battery power. A further disadvantage is that independent power supplies are not feasible for portable products due to the large and continuous power drain on the battery. Still another disadvantage is that data may be lost when batteries are exchanged. The use of independent power supplies does however have certain advantages. Separate circuitry for switching the battery power supply on and off is not required, and the full output voltage of the battery is available for use.

In a circuit using externally switched power supplies, a battery power supply and a line-driven power supply are routed through a switch. The switch isolates the battery and connects the line-driven power supply to the circuit when the line-driven power supply is on. When the line-driven power supply is off, the switch connects the battery to the circuit and isolates the line-driven power supply. Such an approach conserves battery power because the battery is not used when the line-driven power supply is available. Access times can be fast because line power is used to power the access circuitry. This approach does, however, have disadvantages. If the circuit is implemented on an integrated circuit chip, the switch is typically located external to the chip, with the result that circuitry of the switch is costly to implement. Another disadvantage is that the battery is usually isolated by a diode, which dissipates a significant amount of battery energy during battery powered operation.

SUMMARY OF THE INVENTION

In accordance with the illustrated preferred embodiment, the present invention provides a power switching circuit for automatically switching between line-driven and battery power supplies.

The power switching circuit selectively connects first and second input voltage terminals to an output voltage terminal. The first and second input voltage terminals are at first and second input voltages, respectively, with respect to a reference terminal. Power is supplied to the first input voltage terminal by a line-driven power supply, and is supplied to the second input voltage terminal by a battery. When the line-driven power supply is on, the first input voltage supplied by the line-driven power supply is greater than the second input voltage supplied by the battery.

In its simplest form, the power switching circuit includes two field effect transistors and an inverter. Each input voltage terminal is coupled to the output voltage terminal through one of the transistors. The gates of the transistors are coupled to the first input voltage terminal, one directly and the other indirectly through the inverter. When the line-driven power supply is on, a first transistor switches on to connect the first input voltage terminal to the output voltage terminal, and a second transistor switches off to isolate the battery. When the line-driven power supply is off, the first transistor switches off to isolate the line-driven power supply, and the second switches on to connect the battery powered second input voltage terminal to the output voltage terminal.

In comparison with previous approaches, the power switching circuit of the present invention has many advantages. The power switching circuit may be incorporated into an integrated circuit chip, thereby saving the expense of providing separate external components for switching power supply sources. Since the battery is isolated by a transistor rather than a diode, the full battery power is supplied to the chip. When the line-driven power supply is available, the battery is disconnected and isolated to prevent battery drain. Data transfer times are fast because the access circuits may be powered by the line-driven power supply. In addition, the power switching circuit is compatible with complementary metal-oxide-semiconductor (CMOS) circuitry, which is widely used in battery powered products due to its inherently low power consumption.

DETAILED DESCRIPTION OF THE PREFERRED EMBODIMENTS

The preferred embodiments of the present invention are power switching circuits for automatically switching between line-driven and battery power supplies. In conjunction with FIG. 1, a real-time clock circuit that utilizes a power switching circuit will be described. In conjunction with FIGS. 2, 3, 4, and 5, four embodiments of power switching circuits will be described.

Figure 1:
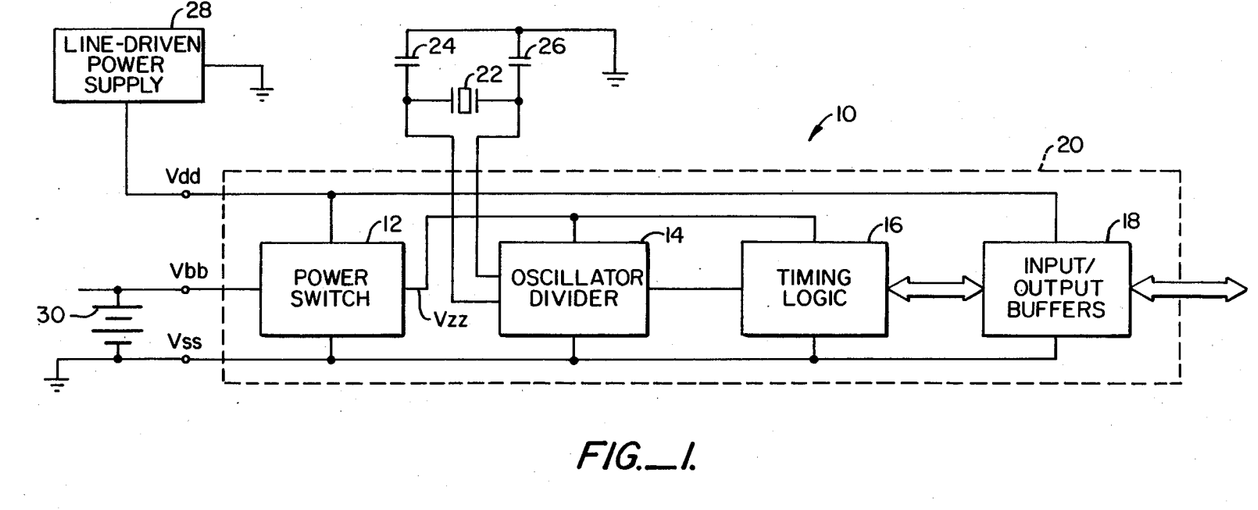
FIG. 1 is a block diagram of a real-time clock circuit that utilizes a power switching circuit according to the present invention.

FIG. 1 shows a real-time clock circuit 10 that utilizes a power switching circuit 12, according to the present invention. The clock circuit includes an oscillator divider circuit 14, a timing logic circuit 16, and input/output buffers 18. Power switch 12, oscillator divider 14, timing logic 16, and buffers 18 are all implemented on an integrated circuit chip, designated by dashed lines 20. External to the chip, a crystal 22 and two capacitors 24 and 26 provide a timing input signal to the oscillator divider circuit.

In order to provide real-time data, portions of the clock circuit are continuously powered. Specifically, the oscillator divider circuit 14 and the timing logic circuit 16 must operate continuously. Two power sources are available to the clock circuit, a line-driven power supply 28 and a battery power supply 30. In FIG. 1, both power supplies are referenced to ground potential, Vss. The positive voltage side of the line-driven power supply is connected to a first input voltage terminal, Vdd, and the negative voltage side is connected to Vss. The positive voltage side of a battery 30 is connected to a second input voltage terminal, Vbb, and the negative voltage side of the battery is connected to Vss. On the chip, Vss is connected to power switch 12, oscillator divider 14, timing logic 16, and buffers 18. Also on the chip, Vbb is connected to the power switch and Vdd is connected to both the power switch and the buffers.

The power switching circuit 12 powers the oscillator divider and timing logic circuits through an internal power bus, Vzz. When line-driven power supply 28 is on, the power switch connects Vdd to Vzz, and the entire clock circuit is powered by the line-driven power supply; the oscillator divider and timing logic circuits indirectly through Vzz, and the input/output buffers directly by Vdd. However, when the line-driven power supply is off, the oscillator divider and timing logic circuits are powered by battery 30, and the buffers are not powered because no data input/output activity is required.

Figure 2:
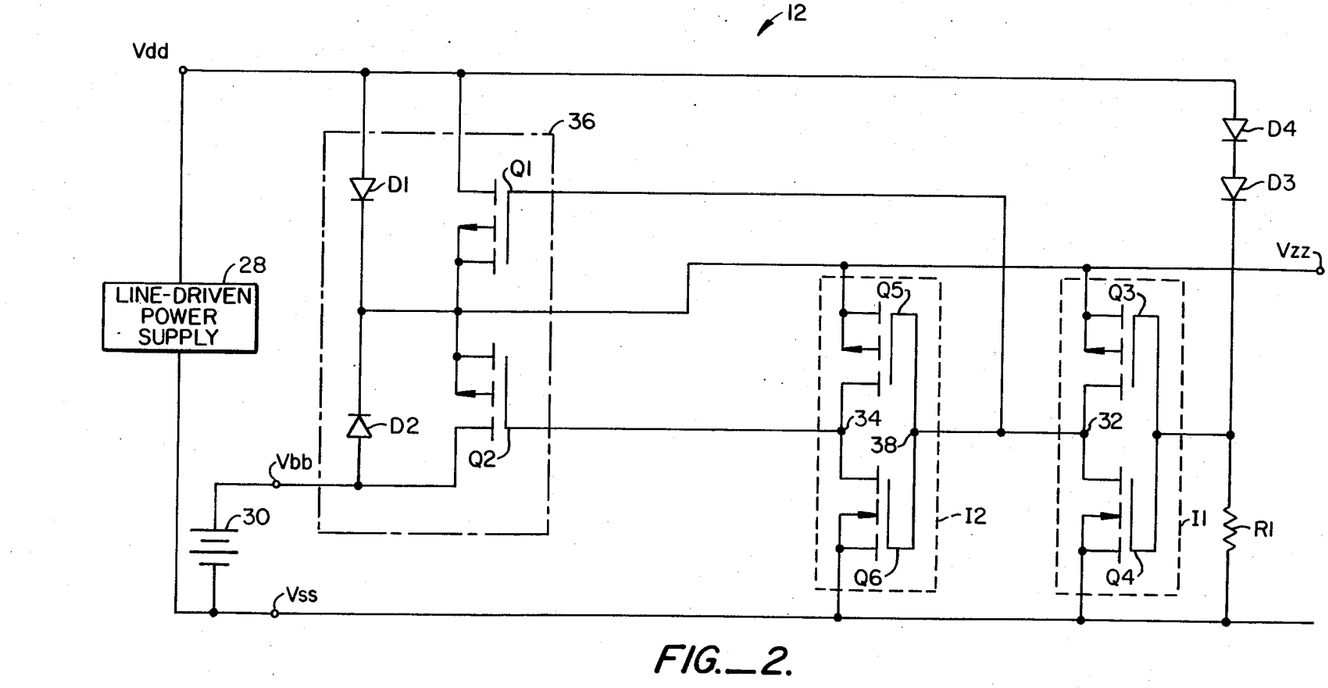
FIG. 2 is a schematic diagram of a first embodiment of a power switching circuit according to the present invention.

In FIG. 2, power switching circuit 12 is shown in greater detail. As described above, the line-driven power supply 28 is connected across Vdd and Vss, while battery 30 is connected across Vbb and Vss. When the line-driven power supply is on, the voltage at Vdd supplied by the line-driven power supply is greater than the voltage at Vbb supplied by the battery. Two field effect transistors, Q1 and Q2, are coupled between Vdd and Vbb, respectively, and an output voltage terminal, Vzz. Vzz is also the internal power bus that powers the oscillator divider and timing logic circuits. Two inverters, 11 and 12, are coupled to the gates of transistors Q1 and Q2 and act to switch transistors Q1 and Q2 according to whether the line-driven power supply is on or off.

Transistors Q1 and Q2 are the main switching elements of the power switch. Both are p-channel enhancement mode metal-oxide-semiconductor field effect transistors, and are fabricated in an N-well 36 within a P- semiconductor substrate. Transistor Q1 has a source terminal coupled to Vdd, a drain terminal coupled to Vzz, and a gate terminal coupled to an output terminal 32 of inverter 11. Transistor Q2 has a source terminal coupled to Vbb, a drain terminal coupled to Vzz, and a gate terminal coupled to an output terminal 34 of inverter 12. Transistors Q1 and Q2 are both constructed in an isolated N-well 36, with the drains of each being coupled to the N-well. Also located in the well 36 are diodes D1 and D2. Diode D1 has its anode connected to Vdd and its cathode connected to Vzz. Diode D2 has its anode connected to Vbb and its cathode connected to Vzz.

Inverters 11 and 12 act to switch transistors Q1 and Q2 according to whether the line-driver power supply is on or off. Each inverter includes a p-channel and an n-channel enhancement mode metal-oxide-semiconductor field effect transistor interconnected to form a CMOS inverter. Both inverters are powered by the potential difference between terminals Vzz and Vss. Inverter I1 has a p-channel transistor Q3 and an n-channel transistor Q4. Transistor Q3 has its source coupled to Vzz and its drain coupled to output terminal 32. Transistor Q4 has its source coupled to Vss and its drain coupled to output terminal 32. Output terminal 32 is coupled to an input terminal 38 of inverter 12 and to the gate of transistor Q1. The gates of both transistor Q3 and Q4 are coupled to Vdd through diodes D3 and D4, and are coupled to Vss through resistor R1. Resistor R1 is preferably a pinched resistor having a large resistance value.

Inverter 12 has a p-channel transistor Q5 and an n-channel transistor Q6. Transistor Q5 has its source coupled to Vzz and its drain coupled to output terminal 34. Transistor Q6 has its source coupled to Vss and its drain coupled to output terminal 34. Output terminal 34 is coupled to the gate of transistor Q2. The gates of both transistors Q5 and Q6 are coupled to output terminal 32 of inverter I1.

In operation, the power switching circuit 12 connects the higher voltage of the two input voltage terminals, Vdd and Vbb, to Vzz. When the line-driven power supply is on, the voltage at Vdd is higher than the voltage at Vbb. In this case, Vdd is connected to Vzz through transistor Q1, and Vbb is isolated. When the line-driven power supply is off, the voltage at Vbb is higher than the voltage at Vdd. In the second case, Vbb is connected to Vzz through transistor Q2, and Vdd is isolated.

The operation of the power switching circuit with the line-driven power supply on will be described first. When the line-driven power supply is on, a voltage equal to the voltage at Vdd minus two diode drops appears at the gates of transistors Q3 and Q4 of inverter I1. This voltage turns transistor Q3 off and transistor Q4 on. A voltage approximately equal to the voltage at Vss is thus applied to the gate of transistor Q1 and to input terminal 38 of inverter 12. Transistor Q1 is turned on by the low voltage applied to its gate by inverter I1, and thus connects Vdd to Vzz. Since the voltage applied to the gates of transistors Q5 and Q6 is approximately equal to the voltage at Vss, transistor Q5 is on and transistor Q6 is off. Transistor Q5 supplies a voltage approximately equal to the voltage at Vzz to the gate of transistor Q2. Transistor Q2 is off because its gate voltage is higher than its source voltage. Diode D2 is reverse biased because the voltage at Vzz is higher than the voltage at Vbb. Thus, the second input voltage terminal, Vbb, and battery 30 are isolated from the rest of the circuit.

When the line-driven power supply is off, the power switching circuit connects Vzz to the battery power supply. The voltage at terminal Vdd is equal to the line-driven power supply voltage when it is on. When the line-driven power supply is first switched off, the voltage at terminal Vdd drifts downward toward the voltage at reference terminal Vss. At some intermediate point, inverter I1 will switch transistor Q3 from off to on and transistor Q4 from on to off. Inverter I1 then applies a voltage approximately equal to the voltage at Vzz to the gate of transistor Q1 and to the input terminal of inverter I2. Transistors Q5 and Q6 of inverter I2 are switched off and on, respectively, by the output voltage of inverter I1. Transistor Q6 supplies a voltage approximately equal to the voltage at Vss to the gate of transistor Q2. Transistor Q2 switches on because its gate voltage is lower than its source voltage. With transistor Q2 on, the voltage of the output terminal, Vzz, is approximately equal to the voltage at Vbb. Transistor Q1 is turned off by the high voltage applied to its gate by inverter I1. Diode D1 is reverse biased when Vzz is at a higher voltage than is Vdd. Thus, the first input voltage terminal, Vdd, is isolated from the rest of the circuit when the line-driven power supply is off.

Diodes D1 and D2 are included in the circuit to solve a potential back gate voltage problem. If the diodes were not included in the circuit, and if well 36 acquired a charge below that of Vss, transistors Q1 and Q2 could not be turned on. To prevent this from happening, diodes D1 and D2 insure that the voltage in well 36 can never be lower than one diode drop below the highest voltage in the circuit.

Figure 3:
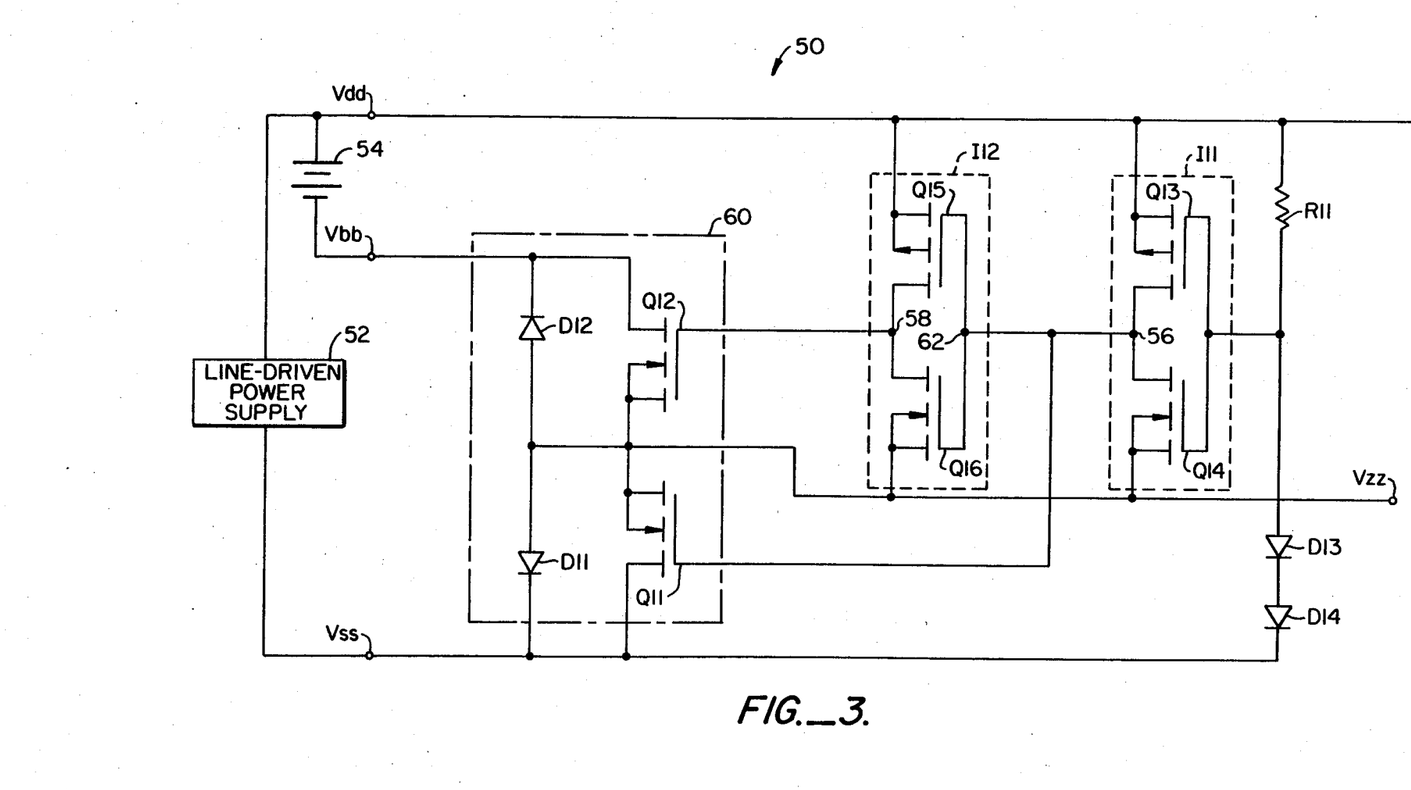
FIG. 3 is a schematic diagram of a second embodiment of a power switching circuit according to the present invention.

In FIG. 3, a second embodiment of a power switching circuit 50 is illustrated. Circuit 50 is similar to circuit 12 described above, but is for use with integrated circuits fabricated on N- semiconductor substrates. In circuit 50, Vdd is a reference voltage terminal, Vss is a first input voltage terminal and is driven by a line-driven power supply 52, Vbb is a second input voltage terminal and is driven by a battery 54, and Vzz is an output voltage terminal that powers the oscillator divider circuit 14 and timing logic circuit 16. Reference voltage terminal Vdd is at a higher potential than are terminals Vbb and Vss, and terminal Vss is at a lower potential than terminal Vbb when the line-driven power supply is on.

Two field effect transistors, Q11 and Q12, are coupled between Vss and Vbb, respectively, and the voltage output terminal, Vzz. Two inverters, I11 and I12, are coupled to the gates of transistors Q11 and Q12 and act to switch transistors Q11 and Q12 according to whether the line-driver power supply is on or off.

Transistors Q11 and Q12 are the main switching elements of the power switching circuit 50. Both are n-channel enhancement mode metal-oxide-semiconductor field effect transistors, and are fabricated in a P- well 60 within an N- semiconductor substrate. Transistor Q11 has a source terminal coupled to Vss, a drain terminal coupled to Vzz, and a gate terminal coupled to an output terminal 56 of inverter I11. Transistor Q12 has a source terminal coupled to Vbb, a drain terminal coupled to Vzz, and a gate terminal coupled to an output terminal 58 of inverter I12. Transistors Q11 and Q12 are both constructed in an isolated p- well 60, with the drains of each being coupled to the P-well. Also located in the well 60 are diodes D11 and D12. Diode D11 has its cathode connected to Vss and its anode connected to Vzz. Diode D12 has its cathode connected to Vbb and its anode connected to Vzz.

Inverters I11 and I12 act to switch transistors Q11 and Q12 according to whether the line-driver power supply is on or off. Each inverter includes a p-channel and an n-channel enhancement mode metal-oxide-semiconductor field effect transistor interconnected to form a CMOS inverter. Both inverters are powered by the potential difference between terminals Vzz and Vdd. Inverter I11 has a p-channel transistor Q13 and an n-channel transistor Q14. Transistor Q13 has its source coupled to Vdd and its drain coupled to output terminal 56. Transistor Q14 has its source coupled to Vzz and its drain coupled to output terminal 56. Output terminal 56 is coupled to an input terminal 62 of inverter I12 and to the gate of transistor Q11. The gates of both transistor Q13 and Q14 are coupled to Vss through diodes D13 and D14, and are coupled to Vdd through resistor R11. Resistor R11 is preferably a pinched resistor having a large resistance value.

Inverter I12 has a p-channel transistor Q15 and an n-channel transistor Q16. Transistor Q15 has its source coupled to Vdd and its drain coupled to output terminal 58. Transistor Q16 has its source coupled to Vzz and its drain coupled to output terminal 58. Output terminal 58 is coupled to the gate of transistor Q12. The gates of both transistors Q15 and Q16 are coupled to output terminal 56 of inverter 11.

In operation, the power switching circuit 50 connects the lower voltage of the two input voltage terminals, Vss and Vbb, to Vzz. When the line-driven power supply is on, the voltage at Vss is lower than the voltage at Vbb. In this case, Vss is connected to Vzz through transistor Q11, and Vbb is isolated. When the line-driven power supply is off, the voltage at Vbb is lower than the voltage at Vss. In the second case, Vbb is connected to Vzz through transistor Q12, and Vss is isolated.

When the line-driven power supply 52 is on, a voltage equal to the voltage at Vss plus two diode drops appears at the gates of transistors Q13 and Q14 of inverter I11. This voltage turns transistor Q13 on and transistor Q14 off. A voltage approximately equal to the voltage at Vdd is thus applied to the gate of transistor Q11 and to the input terminal 62 of inverter I12. Transistor Q11 is turned on by the high voltage applied to its gate by inverter I11, and thus connects Vss to Vzz. Since the voltage applied to the gates of transistors Q15 and Q16 is approximately equal to the voltage at Vdd, transistor Q15 is off and transistor Q16 is on. Transistor Q16 supplies a voltage approximately equal to the voltage at Vzz to the gate of transistor Q12. Transistor Q12 is off because its gate voltage is lower than its source voltage. Diode D12 is reverse biased because the voltage at Vbb is higher than the voltage at Vzz. Thus, the second input voltage terminal, Vbb, and battery 54 are isolated from the rest of the circuit.

When the line-driven power supply is off, the power switching circuit connects Vzz to the battery power supply. When the line-driven power supply is first switched off, the voltage at terminal Vss drifts upward toward the voltage at reference terminal Vdd. At some intermediate point, inverter I11 will switch transistor Q13 from on to off and transistor Q14 from off to on. Inverter I11 then applies a voltage approximately equal to the voltage at Vzz to the gate of transistor Q11 and to the input terminal of inverter I12. Transistors Q15 and Q16 of inverter I12 are switched on and off, respectively, by the output voltage of inverter I11. Transistor Q15 supplies a voltage approximately equal to the voltage at Vdd to the gate of transistor Q12. Transistor Q12 switches on because its gate voltage is higher than its source voltage. With transistor Q12 on, the voltage of the output terminal, Vzz, is approximately equal to the voltage at Vbb. Transistor Q11 is turned off by the low voltage applied to its gate by inverter I11. Diode D11 is reverse biased when Vss is at a higher voltage than is Vzz. Thus, the first input voltage terminal, Vss, is isolated from the rest of the circuit when the line-driven power supply is off. As explained above, diodes D11 and D12 are included in the circuit to solve a potential back gate voltage problem.

Figure 4:
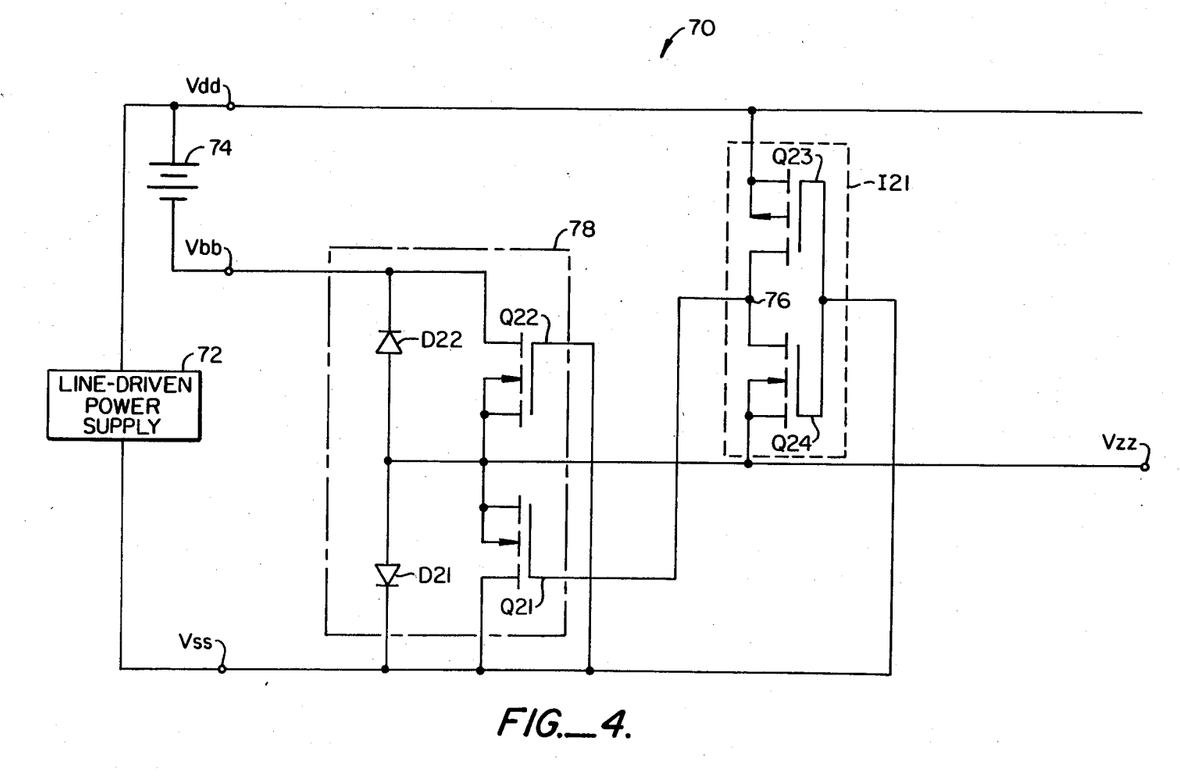
FIG. 4 is a schematic diagram of a third embodiment of a power switching circuit according to the present invention.

In FIG. 4, a third embodiment of a power switching circuit 70 is illustrated. Circuit 70 is similar to circuit 50 descrbed above, in that it is for use with integrated circuits fabricated on N- semiconductor substrates, but is somewhat simpler, having less devices in its circuit. In circuit 70, Vdd is a reference voltage terminal, Vss is a first input voltage terminal and is powered by a line-driven power supply 72, Vbb is a second input voltage terminal and is driven by a battery 74, and Vzz is an output voltage terminal. Reference voltage terminal Vdd is at a higher potential than are terminals Vbb and Vss, and terminal Vss is at a lower potential than terminal Vbb when the line-driven power supply is on.

Two field effect transistors, Q21 and Q22, are coupled between Vss and Vbb, respectively, and the voltage output terminal, Vzz. An inverter, I21, is coupled to the gate of transistor Q21 for switching transistor Q21 according to whether the line-driver power supply is on or off.

Transistors Q21 and Q22 are the main switching elements of the power switching circuit 70. Both are n-channel enhancement mode metal-oxide-semiconductor field effect transistors, and are fabricated in a P- well 78 within an N- semiconductor substrate. Transistor Q21 has a source terminal coupled to Vss, a drain terminal coupled to Vzz, and a gate terminal coupled to an output terminal 76 of inverter I21. Transistor Q22 has a source terminal coupled to Vbb, a drain terminal coupled to Vzz, and a gate terminal coupled to Vss. Transistors Q21 and Q22 are both constructed in an isolated P- well 78, with the drains of each being coupled to the P- well. Also located in P- well 78 are diodes D21 and D22. Diode D2 has its cathode connected to Vss and its anode connected to Vzz. Diode D22 has its cathode connected to Vbb and its anode connected to Vzz.

Inverter I21 includes a p-channel and an n-channel enhancement mode metal-oxide-semiconductor field effect transistor interconnected to form a CMOS inverter. Inverter I21 is powered by the potential difference between terminals Vzz and Vdd. It has a p-channel transistor Q23 and an n-channel transistor Q24. Transistor Q23 has its source coupled to Vdd and its drain coupled to output terminal 76. Transistor Q24 has its source coupled to Vzz and its drain coupled to output terminal 76. Output terminal 76 is coupled to the gate of transistor Q21. The gates of both transistor Q23 and Q24 are coupled to Vss.

In operation, the power switching circuit 70 connects the lower voltage of the two input voltage terminals, Vss and Vbb, to Vzz. When the line-driven power supply is on, the voltage at Vss is lower than the voltage at Vbb. In this case, Vss is connected to Vzz through transistor Q21, and Vbb is isolated. When the line-driven power supply is off, the voltage at Vbb is lower than the voltage at Vss. In the second case, Vbb is connected to Vzz through transistor Q22, and Vss is isolated.

A voltage equal to the voltage at Vss is applied to the gates of transistors Q23 and Q24 of inverter I21. When the line-driven power supply 72 is on, this voltage turns transistor Q23 on and transistor Q24 off. A voltage approximately equal to the voltage at Vdd is thus applied to the gate of transistor Q21, turning transistor Q21 on and connecting Vzz to Vss. Transistor Q22 is off because its gate voltage, Vss, is lower than its source voltage, Vbb. Diode D22 is reverse biased because the voltage at Vbb is higher than the voltage at Vzz. Thus, the second input voltage terminal, Vbb, and battery 74 are isolated from the rest of the circuit.

When the line-driven power supply is off, the power switching circuit connects Vzz to the battery power supply. When the line-driven power supply is first switched off, the voltage at terminal Vss drifts upward toward the voltage at reference terminal Vdd. At some intermediate point, inverter I21 will switch transistor Q23 from on to off and transistor Q24 from off to on. Inverter I21 then applies a voltage approximately equal to the voltage at Vzz to the gate of transistor Q21. Transistor Q22 switches on when the voltage at Vss reaches a threshold voltage higher than the voltage at Vbb. With transistor Q22 on, the voltage of the output terminal, Vzz, is approximately equal to the voltage at Vbb. Transistor Q21 is turned off by the low voltage applied to its gate by inverter I21. Diode D21 is reverse biased when Vss is at a higher voltage than is Vzz. As explained above, diodes D21 and D22 are included in the circuit to solve a potential back gate voltage problem.

Power switching circuit 70 operates in a fashion similar to circuit 50 described in FIG. 3, but with fewer components. One disadvantage of circuit 70 in comparison to circuits 12 and 50 is that it is somewhat susceptible to noise. Voltage spikes at terminal Vss when the line-driven power supply is off may have the effect of temporarily switching transistor Q22 off and disconnecting the power source from the output voltage terminal, Vzz.

Figure 5:
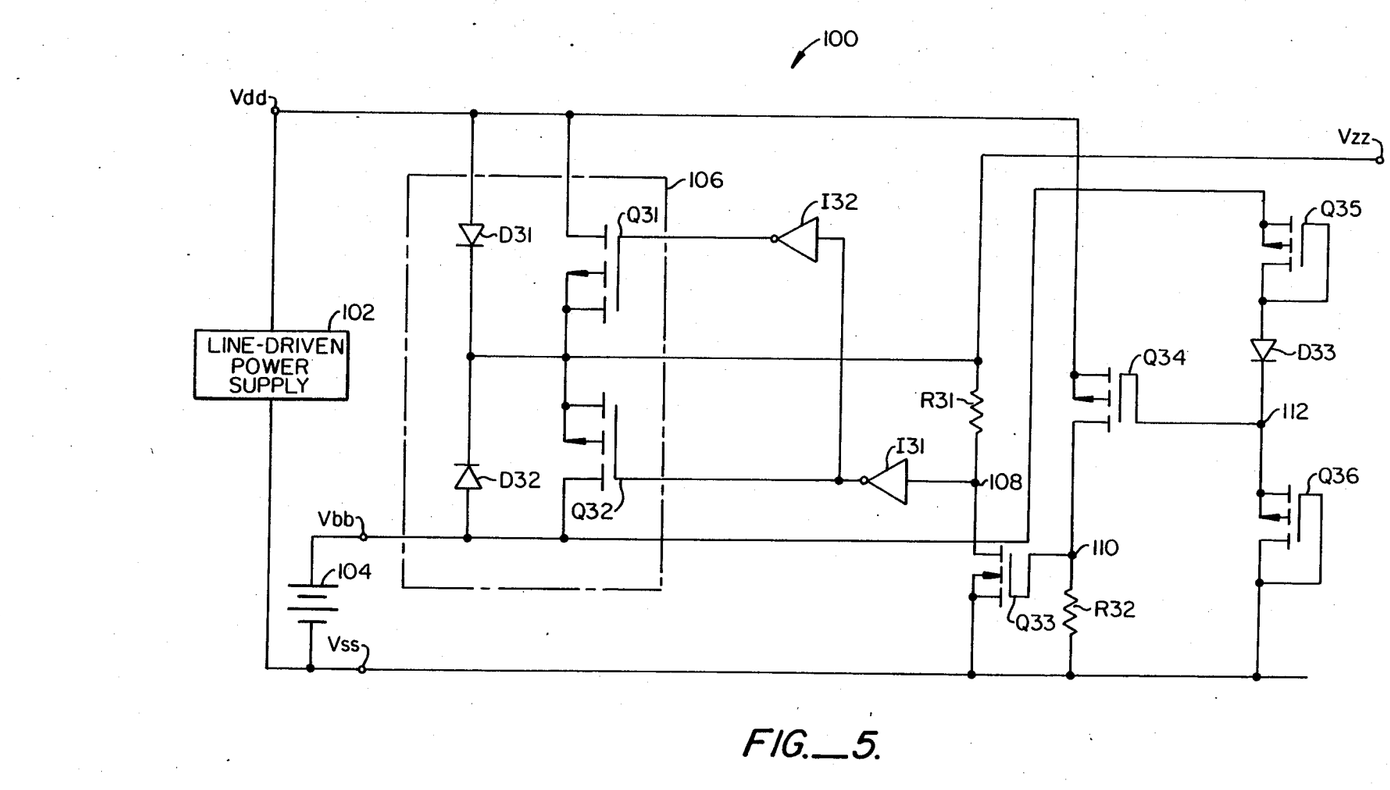
FIG. 5 is a schematic diagram of a fourth embodiment of a power switching circuit according to the present invention.

In FIG. 5, a fourth embodiment of a power switching circuit 100 is illustrated. Circuit 100 is similar to circuit 12 described above, but utilizes a different switching circuit. In circuit 100, Vss is a reference voltage terminal, Vdd is a first input voltage terminal and is driven by a line-driven power supply 102, Vbb is a second input voltage terminal and is driven by a battery 104, and Vzz is an output voltage terminal that powers the oscillator divider circuit 14 and timing logic circuit 16. Input voltage terminal Vbb is at a higher potential than is reference terminal Vss, and terminal Vdd is at a higher potential than terminal Vbb when the line-driven power supply is on.

Transistors Q31 and Q32 are the main switching elements of the power switch, and are coupled between Vdd and Vbb, respectively, and Vzz. Both are p-channel enhancement mode metal-oxide-semiconductor field effect transistors, and are fabricated in an N- well 106 within a P- semiconductor substrate. Transistor Q31 has a source terminal coupled to Vdd, a drain terminal coupled to Vzz, and a gate terminal coupled to an output terminal 32 of inverter I32. Transistor Q32 has a source terminal coupled to Vbb, a drain terminal coupled to Vzz, and a gate terminal coupled to an output terminal 34 of inverter I31. Transistors Q31 and Q32 are both constructed in isolated N-well 106, with the drains of each being coupled to the N-well. Also located in the well 106 are diodes D31 and D32. Diode D31 has its anode connected to Vdd and its cathode connected to Vzz. Diode D32 has its anode connected to Vbb and its cathode connected to Vzz.

The circuitry positioned to the right of transistors Q31 and Q32 in FIG. 5 provides means for switching transistors Q31 and Q32 according to whether the line-driven power supply is on or off. Inverter I31 is coupled between a node 108 and the gate teminal of transistor Q32. Inverter I32 is coupled between the output terminal of inverter I31 and the gate terminal of transistor Q31. Each inverter includes a p-channel and an n-channel enhancement mode metal-oxide-semiconductor field effect transistor interconnected to form a CMOS inverter, as described above in conjunction with inverters I1 and I2. Inverters I31 and I32 are both powered by the potential difference between terminals Vzz and Vss.

The switching means also includes transistors, Q33, Q34, Q35, and Q36, resistors R31 and R32, and diode D33. Transistor Q33 is coupled between node 108 and reference terminal Vss, and has a drain terminal connected to node 108, a source terminal connected to Vss, and a gate terminal connected to a node 110. Resistor R31 is coupled between node 108 and Vzz, while resistor R32 is coupled between node 110 and Vss. Transistor Q34 is coupled between node 110 and Vdd, and has a drain terminal connected to node 110, a source terminal connected to Vdd, and a gate terminal connected to a node 112. Transistor Q35 and diode D33 are coupled in series between node 112 and Vbb. Transistor Q35 has a source terminal connected to Vbb, and drain and gate terminals connected to the anode of diode D33, while the cathode of diode D33 is connected to node 112. Transistor Q36 is coupled between node 112 and Vss, and has a source terminal connected to node 112, and drain and gate terminals connected to Vss. Since the current flow through transistors Q35 and Q36 and diode D33 represents a drain on the battery, transistors Q35 and Q36 and diode D33 are fabricated to minimize the current. Transistors Q34, Q35, and Q36 are p-channel enhancement mode field effect transistors, while transistor Q33 is an n-channel enhancement mode field effect transistor.

The power switching circuit connects either Vdd or Vbb to Vzz, depending upon the voltage of Vdd. When the voltage of Vdd is above a certain level, Vdd is connected to Vzz, otherwise, Vbb is connected to Vzz. The switching means defines the voltage of Vdd at which the transistion between battery and line-driven power is made. Transistors Q35 and Q36 and diode D33 define a reference voltage at node 112 and at the gate of transistor Q34. Since transistor Q34 is a p-channel device, it will be in its conductive state as long as the voltage applied to its source is more than its threshold voltage above the voltage applied to its gate. In other words, transistor Q34 will be on when the voltage of Vdd is more than one threshold voltage above the voltage of node 112.

When the line-driven power supply is on, the voltage of Vdd is sufficient to turn transistor Q34 on. With transistor Q34 on, the voltage at node 110 will be approximately equal to Vdd. Since transistor Q33 is an nchannel device, it will be on when transistor Q34 is on. With transistor Q33 on, the voltage at node 108 and at the input terminal of inverter I31 will be approximately equal to Vss. In response, inverter I31 applies a voltage approximately equal to Vzz to the base of transistor Q32 and inverter I32 applies a voltage approximately equal to Vss to the base of transistor Q31. Since transistors Q31 and Q32 are p-channel devices, Q32 is turned off and Q31 is turned on, which connects Vdd to Vzz and isolates Vbb.

When the line-driven power supply is switched off, the voltage of Vdd drifts downward toward Vss. When the voltage of node 112, transistor Q34 starts to close. This restricts the current flowing through transistor Q34. As a result, the voltage at node 110 is pulled down by resistor R32 and transistor Q33 switches off. With transistor Q33 off, the voltage of node 108 is pulled up to Vzz by resistor R31. In response, inverter I31 applies a low voltage to transistor Q32, turning it on, and inverter I32 applies a high voltage to transistor Q31, turning it off.

Circuit 100 operates in a fashion similar to the other circuits described above. Circuit 100 does, however, have a more stable transition point between battery and line-driven operation. The transition point is relatively independent of variations in the transistor threshold voltage because transistors Q34, Q35, and Q36 compensate for process variations.

From the above description, it will be apparent that the invention disclosed herein provides a novel and advantageous power switching circuit for automatically switching between line-driven and battery power supplies. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A power switching circuit for selectively connecting first and second input voltage terminals to an output voltage terminal, wherein a first input voltage exists between said first input voltage terminal and a reference terminal and a second input voltage exists between said second input voltage terminal and said reference terminal, said circuit comprising:

first and second transistors, said first transistor being coupled to connect said first input voltage terminal to said output voltage terminal and having a gate terminal, said second transistor being coupled to connect said second input voltage terminal to said output voltage terminal and having a gate terminal; and switching means coupled to respond to the voltage at said first input voltage terminal for controlling the conduction in said first and second transistors, said switching means being operable for turning said first transistor on and said second transistor off when the magnitude of said first input voltage exceeds a predetermined value and for turning said first transistor off and said second transistor on when the magnitude of said first input voltage does not exceed said predetermined value, and including first and second inverters, said first inverter having an output terminal coupled to said gate of said second transistor said second inverter having an input terminal coupled to said output terminal of said first inverter and having an output terminal coupled to said gate terminal of said first transistor, said first inverter also having an input terminal coupled to said output voltage terminal through first resistor means and coupled to said reference terminal through a third transistor, said third transistor having a gate terminal coupled to said reference terminal through second resistor means and coupled to said first voltage input terminal through a fourth transistor, said fourth transistor having a gate terminal with a reference voltage applied thereto and operable for switching off when the magnitude of said input voltage does not exceed said predetermined value.

2. A circuit as recited in claim 1 and having said output voltage terminal at a higher voltage than said reference voltage terminal, wherein said first, second, and fourth transistors are p-channel enhancement mode field effect transistors, and wherein said third transistor is an n-channel enhancement mode field effect transistor.

3. A circuit as recited in claim 1 wherein said reference voltage is provided by a fifth transistor and a diode coupled in series between said gate terminal of said fourth transistor and said second input voltage terminal and by a sixth transistor coupled between said gate terminal and said reference terminal.

* * * * *